US012376223B2

(12) United States Patent
Tian

(10) Patent No.: US 12,376,223 B2
(45) Date of Patent: Jul. 29, 2025

(54) CRYSTAL OSCILLATOR CIRCUIT ON PCB, PCB AND SERVER

(71) Applicant: INSPUR SUZHOU INTELLIGENT TECHNOLOGY CO., LTD., Jiangsu (CN)

(72) Inventor: Liliang Tian, Jiangsu (CN)

(73) Assignee: INSPUR SUZHOU INTELLIGENT TECHNOLOGY CO., LTD., Jiangsu (CN)

( * ) Notice: Subject to any disclaimer, the term of this patent is extended or adjusted under 35 U.S.C. 154(b) by 378 days.

(21) Appl. No.: 18/246,292

(22) PCT Filed: Jun. 29, 2021

(86) PCT No.: PCT/CN2021/103302
§ 371 (c)(1),
(2) Date: Mar. 22, 2023

(87) PCT Pub. No.: WO2022/062534
PCT Pub. Date: Mar. 31, 2022

(65) Prior Publication Data
US 2023/0380051 A1  Nov. 23, 2023

(30) Foreign Application Priority Data

Sep. 27, 2020  (CN) .......................... 202011033929.6

(51) Int. Cl.
*H05K 1/02*  (2006.01)
*H03B 5/18*  (2006.01)

(52) U.S. Cl.
CPC ............. *H05K 1/0243* (2013.01); *H03B 5/18* (2013.01); *H05K 1/0215* (2013.01);
(Continued)

(58) Field of Classification Search
CPC .................................................. H05K 1/0243
(Continued)

(56) References Cited

U.S. PATENT DOCUMENTS

| 7,525,192 B2* | 4/2009 | Shen ............... H05K 1/0243 257/659 |
| 2010/0208573 A1* | 8/2010 | Adams ............... G11B 9/149 369/126 |
| 2020/0026393 A1* | 1/2020 | Gourevitch ........... G06F 3/0446 |

FOREIGN PATENT DOCUMENTS

| CN | 201766563 U | 3/2011 |
| CN | 104320905 A | 1/2015 |

(Continued)

OTHER PUBLICATIONS

Search report for PCT/CN2021/103302 mailed on Sep. 28, 2021.
Search report for Chinese application 202011033929.6, filed Sep. 27, 2020.

*Primary Examiner* — Stanley Tso
(74) *Attorney, Agent, or Firm* — Dennemeyer & Associates LLC

(57) ABSTRACT

The present disclosure discloses a crystal oscillator circuit on a PCB. The crystal oscillator circuit includes a crystal oscillator including an input end, an output end, a first grounding end and a second grounding end; a first capacitor with one end connected to the input end; and a second capacitor with one end connected to the output end, wherein the first grounding end is connected to a first grounding hole, the second grounding end is connected to a second grounding hole, the other end of the first capacitor is connected to a third grounding hole, the other end of the second capacitor is connected to a fourth grounding hole. The present disclosure further discloses the PCB and a server.

16 Claims, 4 Drawing Sheets

(52) U.S. Cl.
CPC .............. *H05K 2201/09218* (2013.01); *H05K 2201/10075* (2013.01); *H05K 2201/10287* (2013.01)

(58) Field of Classification Search
USPC ......................................................... 361/760
See application file for complete search history.

(56) References Cited

FOREIGN PATENT DOCUMENTS

| | | |
|---|---|---|
| CN | 205378339 U | 7/2016 |
| CN | 109660228 A | 4/2019 |
| CN | 209624696 U | 11/2019 |
| CN | 112117971 A | 12/2020 |

\* cited by examiner

CRYSTAL OSCILLATOR CIRCUIT ON PCB, PCB AND SERVER

CROSS-REFERENCE TO RELATED APPLICATIONS

This is a 35 U.S.C. 371 National Stage Patent Application of International Application No. PCT/CN2021/103302, filed Jun. 29, 2021, which claims priority to Chinese application 202011033929.6, filed Sep. 27, 2020, each of which is hereby incorporated by reference in its entirety.

TECHNICAL FIELD

The present disclosure relates to the field of crystal oscillators, and more particularly to a crystal oscillator circuit on a PCB, the PCB and a server.

BACKGROUND

A crystal oscillator clock signal is a pulse width modulation signal through which an output end obtains a series of pulses equal in amplitude to replace sine waves or needed waveforms. In other words, a plurality of pulses are generated in a half period of an output waveform, equivalent voltages of the pulses are sine waveform, acquired output is smooth, and low-order harmonics. Widths of the pulses are modulated according to a certain rule, which can change an output voltage of a circuit, as well as change an output frequency.

A voltage sharply changes along with time to generate an electric field, a current sharply changes along with time to generate a magnetic field, and thus, an electromagnetic field is generated. The clock signal can be seen from a waveform of the pulse width modulation signal along with sharp changes of voltage signal or current signal, and thus, the clock signal will certainly generate a strong electric field and a strong magnetic field. Strong radiation emission will be caused without attention in design, which finally causes that electromagnetic radiation energy exceeds a threshold requirement.

SUMMARY

Embodiment of the present disclosure provides a crystal oscillator circuit on a PCB, including:
a crystal oscillator including an input end, an output end, a first grounding end and a second grounding end;
a first capacitor with one end connected to the input end; and
a second capacitor with one end connected to the output end,
wherein the first grounding end is connected to a first grounding hole, the second grounding end is connected to a second grounding hole, the other end of the first capacitor is connected to a third grounding hole, and the other end of the second capacitor is connected to a fourth grounding hole; and
the first grounding hole, the second grounding hole, the third grounding hole and the fourth grounding hole are independent of one another and are not in ground connection to a motherboard on a layer where the crystal oscillator circuit is located.

In some embodiments, a distance between the first capacitor and the crystal oscillator and a distance between the second capacitor and the crystal oscillator are within a first preset interval range.

In some embodiments, the crystal oscillator circuit further includes:
a first differential signal line connected to one end of the first capacitor;
a second differential signal line connected to one end of the second capacitor; and
a guard trace constructed to surround the crystal oscillator, the first capacitor, the second capacitor, the first differential signal line and the second differential signal line,
wherein the guard trace is provided with a plurality of fifth grounding holes.

In some embodiments, the guard trace is not connected to the first grounding hole, the second grounding hole, the third grounding hole and the fourth grounding hole, and is not in ground connection to the motherboard on the layer where the crystal oscillator circuit is located.

In some embodiments, a distance between every two adjacent fifth grounding holes is within a second preset interval range.

In some embodiments, the guard trace includes a first part, a second part and a third part, wherein the first part and the second part are located on two sides of the crystal oscillator, widths of the first part and widths of the second part are within a third preset interval range, the third part is located below the crystal oscillator, and a width of the third part is not less than the widths of the first part or the widths of the second part.

In some embodiments, a distance between the first part and the first differential signal line, a distance between the second part and the second differential signal line, a distance between the first part and other signal lines or a ground wire of the layer where the crystal oscillator circuit is located, and a distance between the second part and other signal lines or the ground wire of the layer where the crystal oscillator circuit is located are within a fourth preset interval range.

In some embodiments, a corner of the third part is greater than a preset value, or the corner of the third part is in an arc shape.

Based on the same inventive concept, according to another aspect of the present disclosure, the embodiment of the present disclosure further provides a PCB including the crystal oscillator circuit according to any above embodiment.

Based on the same inventive concept, according to another aspect of the present disclosure, the embodiment of the present disclosure further provides a server including the PCB according to the above embodiments.

BRIEF DESCRIPTION OF THE DRAWINGS

In order to describe technical solutions in embodiments of the present disclosure or the related art more clearly, drawings required to be used in the descriptions of the embodiments or the related art will be simply introduced below, obviously, the drawings described below are only some embodiments of the present disclosure, and those of ordinary skill in the art can obtain other embodiments according to the drawings without creative work.

DETAILED DESCRIPTION OF THE EMBODIMENTS

To make purposes, technical solutions and advantages of the present disclosure more clearly understood, the embodiments of the present disclosure are further described in detail by combining specific embodiments and in reference to drawings.

It needs to be explained that expressions of "first" and "second" used in the embodiments of the present disclosure are intended to distinguish two different entities with the same name or two different parameters with the same name, and it is apparent that "first" and "second" facilitate expressions only but cannot be understood as limiting on the embodiments of the present disclosure, which is not described in detail in subsequent embodiments.

Figure 1:
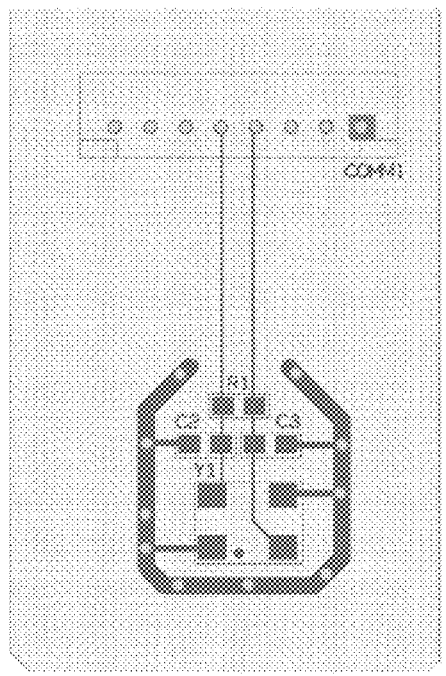
FIG. 1 is a wiring diagram of a crystal oscillator circuit in the related art.

FIG. 1 is a wiring diagram of a common crystal oscillator in the industry. In the figure, Y1 is the crystal oscillator, C2 and C3 are filter capacitors, and R1 is a resistor. In a common crystal oscillator design circuit in the industry, a Ground (GND) is usually laid below the crystal oscillator, and the crystal oscillator and GNDs of the capacitors are connected to a GND of a motherboard, in this case, a server radiation emission threshold is defined as an A-level in the common design circuit, although the crystal oscillator can outwards radiate energy, due to a high test threshold, an A-level test can be passed via multi-time debugging in most causes while a B-level electromagnetic radiation test threshold cannot be passed.

Figure 2:
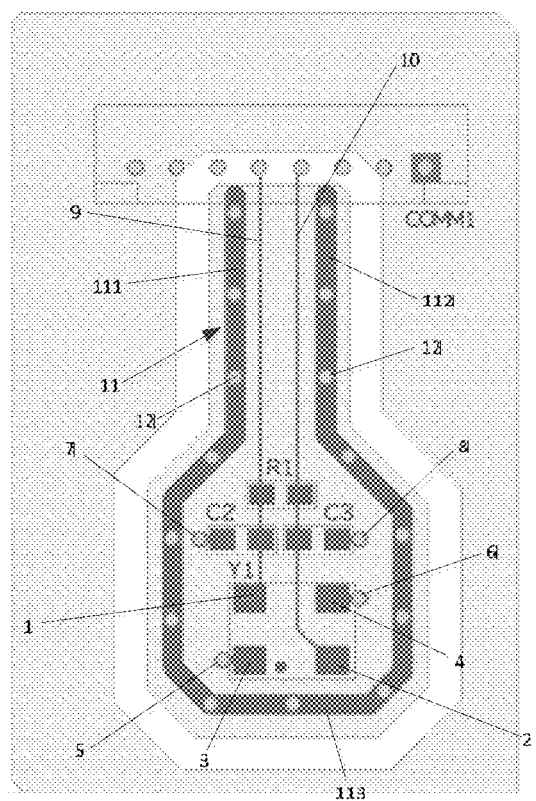
FIG. 2 is a structural connection schematic diagram of a crystal oscillator circuit on a PCB according to an embodiment of the present disclosure.

According to one aspect of the present disclosure, the embodiment of the present disclosure provides a crystal oscillator circuit on a PCB, as shown in FIG. 2, which may include:

a crystal oscillator Y1 including an input end 1, an output end 2, a first grounding end 3 and a second grounding end 4;

a first capacitor C2 with one end connected to the input end 1; and a second capacitor C3 with one end connected to the output end 2, wherein the first grounding end 3 is connected to a first grounding hole 5, the second grounding end 4 is connected to a second grounding hole 6, the other end of the first capacitor C2 is connected to a third grounding hole 7, and the other end of the second capacitor C3 is connected to a fourth grounding hole 8; and the first grounding hole 5, the second grounding hole 6, the third grounding hole 7 and the fourth grounding hole 8 are independent of one another and are not in ground connection to a motherboard on a layer where the crystal oscillator circuit is located.

By means of the solution provided by the present disclosure, crystal oscillator design radiation emission of the server can satisfy the B-level, which is reduced by 90% or above compared with A-level radiation of the server in the same industry.

In some embodiments, a distance between the first capacitor C2 and the crystal oscillator Y1 and a distance between the second capacitor C3 and the crystal oscillator Y1 are within a first preset interval range.

In some embodiments, the capacitors C2 and C3 should be placed at positions close to the crystal oscillator as much as possible, the distance between the first capacitor C2 and the crystal oscillator Y1 and the distance between the second capacitor C3 and the crystal oscillator Y1 are within the first preset interval range, in some embodiments, the first preset interval may be 60 mil-90 mil (mil being a unit of length), and to achieve a better filtering effect, a distance between the capacitors and the crystal oscillator may not be greater than 90 mil.

In some embodiments, as shown in FIG. 2, two filter capacitors C2 and C3, a crystal oscillator Y1 and circuits corresponding to a control chip COMM1 need to be placed on the same layer, so as to avoid a radiation emission risk. For capacitance values of the two filter capacitors C2 and C3, refer to 25 pf-30 pf (pf being a unit of capacitance), and crystal oscillator pads should be directly connected through a straight line. A resistor R1 of 50 ohms may be added behind the capacitors to be connected between an input line of the crystal oscillator and an output line of the crystal oscillator.

In some embodiments, the crystal oscillator circuit further includes:

a first differential signal line 9 connected to one end of the first capacitor C2;

a second differential signal line 10 connected to one end of the second capacitor C3; and a guard trace 11 constructed to surround the crystal oscillator Y1, the first capacitor C2, the second capacitor C3, the first differential signal line 9 and the second differential signal line 10, wherein the guard trace 11 is provided with a plurality of fifth grounding holes 12.

In some embodiments, as shown in FIG. 2, to achieve a desirable filtering and protecting effect, a ground wrapping design is usually adopted in the crystal oscillator, that is, the guard trace 11 is utilized for wrapping the crystal oscillator. In an existing crystal oscillator circuit, as shown in FIG. 1, the guard trace only wraps the crystal oscillator Y1, the capacitors C2 and C3 and the resistor but does not wrap the differential lines, which cannot protect radiations generated by the differential lines.

It needs to be explained that the guard trace 11 is equivalent to a layer of plated metal wire, and the plurality of fifth grounding holes 12 are through holes drilled in the guard trace.

In some embodiments, the guard trace is not connected to the first grounding hole, the second grounding hole, the third grounding hole and the fourth grounding hole, and is not in ground connection to the motherboard on the layer where the crystal oscillator circuit is located.

In some embodiments, both the grounding hole 5 (6) of the crystal oscillator and the grounding hole 7 (8) of the filter capacitors should have independent GNDs, which cannot be in ground connection to the motherboard on the layer where the crystal oscillator circuit is located and cannot be connected to the guard trace neither, so as to prevent mutual crosstalk of interfering energy.

In some embodiments, a distance between every two adjacent fifth grounding holes 12 is within a second preset interval range.

In some embodiments, as shown in FIG. 2, the distance between the fifth grounding holes 12 is within the second preset interval range, which can avoid a situation that due to the too dense fifth grounding holes, the guard trace 11 cannot provide a protection function, and meanwhile guarantee a better electromagnetic compatibility effect. In some embodiments, the second preset interval may be 100 mil-200 mil.

Through the plurality of fifth grounding holes 12, the guard trace 11 of the crystal oscillator Y1 and a GND of a Printed Circuit Board (PCB) can be subjected to low-impedance lap joint, and accordingly, GND shield is performed nearby the crystal oscillator Y1 through a Faraday cage, thereby preventing crystal oscillator energy radiation from being emitted into space.

In some embodiments, the guard trace 11 includes a first part 111, a second part 112 and a third part 113, wherein the first part 111 and the second part 112 are located on two sides of the crystal oscillator Y1, widths of the first part 111 and widths of the second part 112 are within a third preset interval range, and in some embodiments, the third preset interval may be greater than 50 mil; and the third part 113 is located below the crystal oscillator Y1, and a width of the third part 113 is not less than the widths of the first part 111 or the widths of the second part 112.

Figure 3:
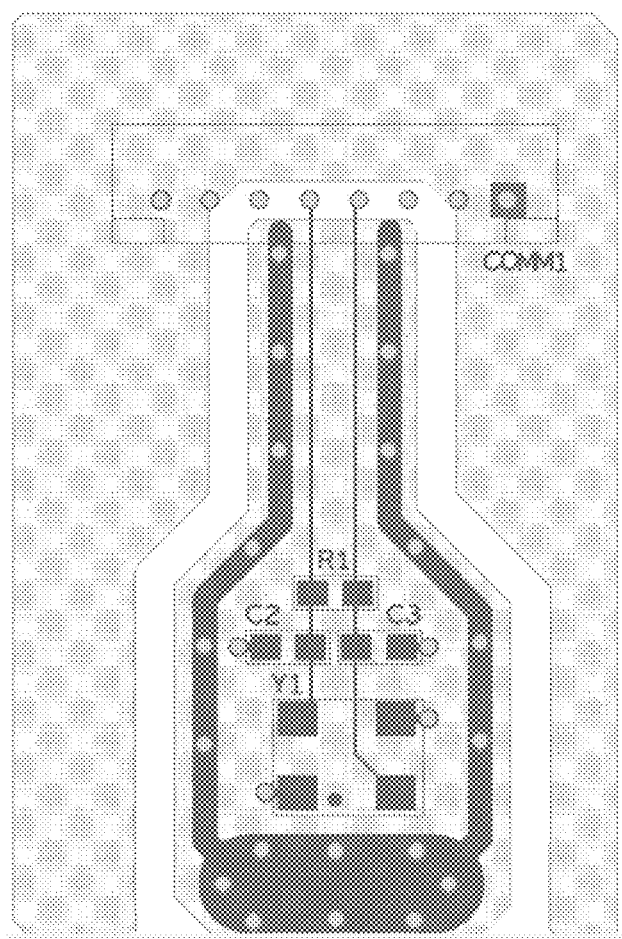
FIG. 3 is another structural connection schematic diagram of a crystal oscillator circuit on a PCB according to an embodiment of the present disclosure.

In some embodiments, as shown in FIG. 2 and FIG. 3, in an actual circuit design process, the crystal oscillator may be placed at a position in a middle of the PCB and may also be placed on an edge of the board, and particularly, there may be a situation that the board is small and has a limited space. As shown in FIG. 2, when the crystal oscillator is placed in the middle of the PCB, the width of the third part 113 may be the same with the width of the first part 111 and the width of the second part 112. As shown in FIG. 3, when the crystal oscillator Y1 is placed on the edge of the PCB, the width of the third part 113 needs to be greater than the width of the first part 111 and the width of the second part 112.

Figure 4:
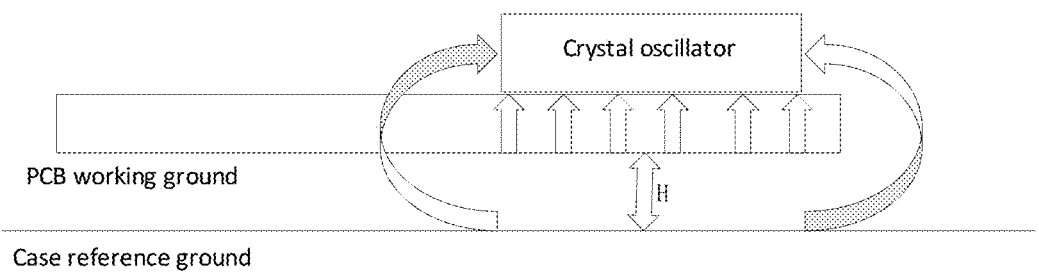
FIG. 4 is an electric field distribution schematic diagram between a crystal oscillator on an edge of a PCB and a reference grounding plate according to an embodiment of the present disclosure.

In some embodiments, as shown in FIG. 4, when a tested product is placed in a radiation emission test environment, a high-speed signal line or a high-speed device in the tested product and a reference grounding plate in a laboratory will form certain capacitive coupling, and electric field distribution or stray capacitance exists between the high-speed signal line or the high-speed device in the tested product and the reference grounding plate in the laboratory, the stray capacitance is low (less than 0.1 pf), which can still cause common mode radiation of the product. According to a principle for producing the common mode radiation, a voltage on a crystal oscillator shell (a crystal oscillator with the shell not connected to 0V) or a voltage U on a crystal oscillator clock signal and the reference grounding plate generate a parasitic loop. In the server design process, if there is a cable above the crystal oscillator, common mode current in the loop generates common mode radiation through the cable, and the common mode radiation current I_CM=C*ω*U_DM, wherein C is stray capacitance between a signal in the PCB and a grounding plane and is about 0.1 pf-several pf, w represents a signal angular frequency, the common mode current I_CM is between several microamperes and tens of microamperes, and it may be seen from the formula that the common mode current of the order of magnitudes flowing above the crystal oscillator can cause that radiation emission exceeds the standard.

It may be seen from the above analysis that the main point for causing the cable common mode radiation by coupling between the crystal oscillator and the reference grounding plate is the stray capacitance between the crystal oscillator and the reference grounding plate, that is, the higher the stray capacitance is, the more serious the coupling between the crystal oscillator and the reference grounding plate becomes, the larger the flowing common mode current is, and on the contrary, the smaller the common mode current is. The stray capacitance actually means that electric field distribution exists between the crystal oscillator and the reference grounding plate, and when a voltage difference between the crystal oscillator and the reference grounding plate is constant, the more electric field distribution therebetween is, the higher the electric field intensity therebetween becomes, and as a result, the higher the stray capacitance therebetween becomes. It may be seen from FIG. 4 that when the crystal oscillator is farther from a board edge of the PCB, electric field distribution between the crystal oscillator and the reference grounding plate is less, and when the crystal oscillator is closer to the board edge, the generated electric field intensity is higher, and thus generated radiation emission is larger.

When the crystal oscillator is arranged in the middle of the PCB or far away from the edge of the PCB, due to a working ground in the PCB, most of the electric field is controlled between the crystal oscillator and the working ground of the PCB, that is, the electric field, distributed to the reference grounding plate, in the PCB is greatly reduced, and thus, the stray capacitance between the crystal oscillator and the reference grounding plate is greatly reduced. It can also be seen from the above analysis that when the crystal oscillator is arranged on the edge of the PCB, radiation emission will exceed the standard, but when the crystal oscillator moves towards an interior of the board, radiation emission is reduced.

It may be concluded from the analysis of the above section that the common mode current in the loop generates common mode radiation through the cable, the common mode radiation current I_CM=C*ω*U_DM, where, C is the stray capacitance between the signal in the PCB and the grounding plane and is about 0.1 pf-several pf, and w represents the signal angular frequency. When the guard trace is in low-impedance lap joint with the GND of the PCB, the U_DM value is ⅒ of an initial value, C is the stray capacitance between the signal in the PCB and the grounding plane which may be reduced to ⅒ of an initial value, and since the radiation current I_CM=C*ω*U_DM may be reduced to 1/100 of an initial value, when the radiation current is greatly reduced, the probability of generating the radiation emission problem is greatly reduced.

The common mode current in the loop generates common mode radiation through the cable, the common mode radiation current I_CM=C*ω*U_DM, where, C is the stray capacitance between the signal in the PCB and the grounding plane and is about 0.1 pf-several pf, w represents the signal angular frequency, the common mode radiation current I_CM is between several microamperes and tens of microamperes, and it may be seen from the formula that the common mode current of the order of magnitudes flowing above the crystal oscillator can cause that radiation emission exceeds the standard. The stray capacitance actually means that electric field distribution exists between the crystal oscillator and the reference grounding plate, and when the voltage difference between the crystal oscillator and the reference grounding plate is constant, the more electric field distribution therebetween is, the higher the electric field intensity therebetween becomes, and as a result, the higher the stray capacitance therebetween becomes. It may be seen from FIG. 4 that when the crystal oscillator is farther from the board edge of the PCB, electric field distribution between the crystal oscillator and the reference grounding plate is less, and when the crystal oscillator is closer to the board edge, the generated electric field intensity is higher, and thus generated radiation emission is larger.

It may be seen from the above analysis that when the crystal oscillator is close to the board edge, how to perform processing to achieve a desirable radiation emission effect is a big problem in the industry, and persons carry out multi-time study and experiments to conclude that when the crystal oscillator is placed on the board edge, the width of the third part 113 needs to be set to be greater than the width of the first part 111 and the width of the second part. For example, a GND copper foil of at least 1 centimeter is paved at a place where the crystal oscillator is close to the board edge, and since 1 centimeter=10 millimeters=393.7 mil, the GND copper foil of 393.7 mil is added between the crystal oscillator and the board below the crystal oscillator.

In some embodiments, a corner of the third part is greater than a preset value, or is in an arc shape.

In some embodiments, the copper foil cannot have a 90-degree corner or an acute angle, an obtuse-angle or arc copper foil needs to be adopted, and if there is the 90-degree corner or the acute angle, a large radiation field will be generated at the corner, which can cause radiation emission exceeding the standard. Similarly, the copper foil also needs to be provided with a plurality of fifth grounding holes, and the distance between the plurality of fifth grounding holes is within the second preset interval.

In some embodiments, a distance between the first part 111 and the first differential signal line 9, a distance between the second part 112 and the second differential signal line 10, a distance between the first part 111 and other signal lines or a ground wire of the layer where the crystal oscillator circuit is located, and a distance between the second part 112 and other signal lines or the ground wire of the layer where the crystal oscillator circuit is located are within a fourth preset interval range.

In some embodiments, to ensure a desirable electromagnetic compatibility effect, the guard trace 11 needs to be spaced from other wires or the ground wire by a preset distance, and in some embodiments, the fourth preset interval range may be 10 mil-20 mil. When an outer side of the guard trace 11 is a reference ground wire of the layer, a gap formed therebetween should have an anti-pad interval of 10 mil-20 mil.

By means of the solution provided by the present disclosure, crystal oscillator design radiation emission of the server can satisfy the B-level, which is reduced by 90% or above compared with A-level radiation of the server in the same industry.

Figure 5:
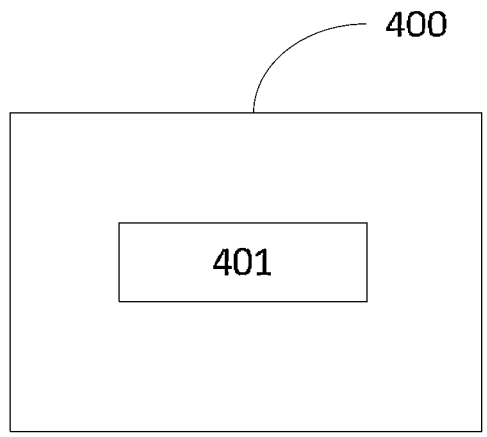
FIG. 5 is a structural schematic diagram of a PCB according to an embodiment of the present disclosure.

Based on the same inventive concept, according to another aspect of the present disclosure, the embodiment of the present disclosure further provides a PCB 400, as shown in FIG. 5, which includes the crystal oscillator circuit 401 according to any above embodiment.

Figure 6:
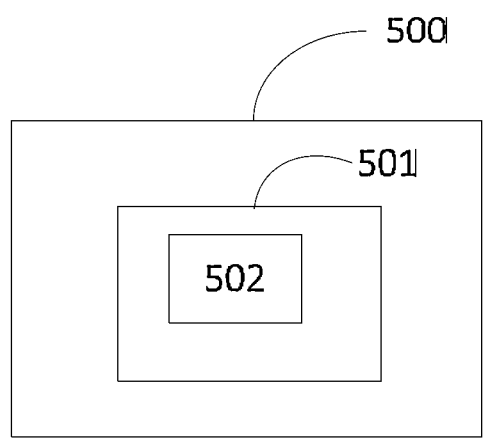
FIG. 6 is a schematic structural diagram of a server according to an embodiment of the present disclosure.

Based on the same inventive concept, according to another aspect of the present disclosure, the embodiment of the present disclosure further provides a server 500, as shown in FIG. 6, which includes:

a PCB 501 including the crystal oscillator circuit 502 according to any above embodiment.

The above contents are exemplary embodiments of the present disclosure, but it is to be noted that various transformations and modifications may be performed without departing from the scope of the disclosure of the embodiments of the present disclosure limited by the claims. Functions, steps and/or actions of the method claims of the disclosed embodiments described herein may be executed without obeying any specific sequence. In addition, although elements disclosed by the embodiments of the present disclosure may be described or required in a singular form, more elements can also be understood, unless clearly limited as the singular form.

It is to be understood that the singular form "one" used in the content is also intended to include a plural form, unless the context clearly supports exceptional cases. It is also to be understood that "and/or" used in the content is intended to include any and all possible combinations of one or more of the associated listed items.

The disclosed embodiment serial numbers of the embodiments of the present disclosure are merely used for descriptions instead of representing good or bad of the embodiments.

Those of ordinary skill in the art should understand that the discussion about any above embodiment is exemplary and is not intended to imply that the scope (including the claims) of the disclosure of the embodiments of the present disclosure is limited to these examples; and under the idea of the embodiments of the present disclosure, technical features in the above embodiments or in different embodiments can also be combined while many other changes of different aspects in the above embodiments of the present disclosure exist, and for brevity, are not provided in detail. Thus, any omission, modification, equivalent replacement, improvement, etc., made within the spirit and principle of the embodiments of the present disclosure shall fall within the scope of protection of the embodiments of the present disclosure.

What is claimed is:

1. A crystal oscillator circuit on a PCB, comprising:
   a crystal oscillator comprising an input end, an output end, a first grounding end and a second grounding end;
   a first capacitor with one end connected to the input end; and
   a second capacitor with one end connected to the output end,
   wherein the first grounding end is connected to a first grounding hole, the second grounding end is connected to a second grounding hole, the other end of the first capacitor is connected to a third grounding hole, and the other end of the second capacitor is connected to a fourth grounding hole; and
   the first grounding hole, the second grounding hole, the third grounding hole and the fourth grounding hole are independent of one another and are not in ground connection to a motherboard on a layer where the crystal oscillator circuit is located;
   the crystal oscillator circuit on the PCB further comprises:
   a first differential signal line connected to one end of the first capacitor;
   a second differential signal line connected to one end of the second capacitor;
   and a guard trace constructed to surround the crystal oscillator, the first capacitor, the second capacitor, the first differential signal line and the second differential signal line,
   wherein the guard trace is provided with a plurality of fifth grounding holes;
   wherein the guard trace comprises a first part, a second part and a third part, wherein the first part and the second part are located on two sides of the crystal oscillator,
   widths of the first part and widths of the second part are within a third preset interval range,
   the third part is located below the crystal oscillator,
   and a width of the third part is not less than the width of the first part or the width of the second part.

2. The crystal oscillator circuit as claimed in claim 1, wherein a distance between the first capacitor and the crystal oscillator and a distance between the second capacitor and the crystal oscillator are within a first preset interval range.

3. The crystal oscillator circuit as claimed in claim 1, wherein the guard trace is not connected to the first grounding hole, the second grounding hole, the third grounding hole and the fourth grounding hole, and is not in ground connection to a motherboard on a layer where the crystal oscillator circuit is located.

4. The crystal oscillator circuit as claimed in claim 1, wherein a distance between every two adjacent fifth grounding holes is within a second preset interval range.

5. The crystal oscillator circuit as claimed in claim 1, wherein a distance between the first part and the first differential signal line is within a fourth preset interval range, a distance between the second part and the second differential signal line is within the fourth preset interval range, a distance between the first part and other signal lines or a ground wire of the layer where the crystal oscillator circuit is located is within the fourth preset interval range, and a distance between the second part and other signal lines or the ground wire of the layer where the crystal oscillator circuit is located is within the fourth preset interval range.

6. The crystal oscillator circuit as claimed in claim 1, wherein a corner of the third part is greater than a preset value, or the corner of the third part is in an arc shape.

7. The crystal oscillator circuit as claimed in claim 1, wherein the first capacitor, the second capacitor, the crystal oscillator and circuits corresponding to a control chip are placed on the same layer.

8. The crystal oscillator circuit as claimed in claim 1, wherein a resistor is added behind the first capacitor and the second capacitor to be connected between an input line of the crystal oscillator and an output line of the crystal oscillator.

9. The crystal oscillator circuit as claimed in claim 1, wherein the guard trace of the crystal oscillator and a GND of a PCB are subjected to low-impedance lap joint through the plurality of fifth grounding holes.

10. The crystal oscillator circuit as claimed in claim 1, wherein the crystal oscillator is placed in the middle of a PCB, the width of the third part is the same with the width of the first part and the width of the second part, when the crystal oscillator is placed on the edge of the PCB, the width of the third part is greater than the width of the first part and the width of the second part.

11. A PCB, comprising a crystal oscillator circuit, wherein the crystal oscillator circuit comprising:
a crystal oscillator comprising an input end, an output end, a first grounding end and a second grounding end;
a first capacitor with one end connected to the input end; and
a second capacitor with one end connected to the output end,
wherein the first grounding end is connected to a first grounding hole, the second grounding end is connected to a second grounding hole, the other end of the first capacitor is connected to a third grounding hole, and the other end of the second capacitor is connected to a fourth grounding hole; and
the first grounding hole, the second grounding hole, the third grounding hole and the fourth grounding hole are independent of one another and are not in ground connection to a motherboard on a layer where the crystal oscillator circuit is located;
the crystal oscillator circuit further comprises:
a first differential signal line connected to one end of the first capacitor;
a second differential signal line connected to one end of the second capacitor;
and a guard trace constructed to surround the crystal oscillator, the first capacitor, the second capacitor, the first differential signal line and the second differential signal line,
wherein the guard trace is provided with a plurality of fifth grounding holes;
wherein the guard trace comprises a first part, a second part and a third part,
wherein the first part and the second part are located on two sides of the crystal oscillator,
widths of the first part and widths of the second part are within a third preset interval range,
the third part is located below the crystal oscillator,
and a width of the third part is not less than the width of the first part or the width of the second part.

12. The PCB as claimed in claim 11, wherein a distance between the first capacitor and the crystal oscillator and a distance between the second capacitor and the crystal oscillator are within a first preset interval range.

13. The PCB as claimed in claim 11, wherein the guard trace is not connected to the first grounding hole, the second grounding hole, the third grounding hole and the fourth grounding hole, and is not in ground connection to a motherboard on a layer where the crystal oscillator circuit is located.

14. The PCB as claimed in claim 11, wherein a distance between every two adjacent fifth grounding holes is within a second preset interval range.

15. The PCB as claimed in claim 11, wherein a distance between the first part and the first differential signal line is within a fourth preset interval range, a distance between the second part and the second differential signal line is within the fourth preset interval range, a distance between the first part and other signal lines or a ground wire of the layer where the crystal oscillator circuit is located is within the fourth preset interval range, and a distance between the second part and other signal lines or the ground wire of the layer where the crystal oscillator circuit is located is within the fourth preset interval range.

16. A server, comprising a crystal oscillator circuit, wherein the crystal oscillator circuit comprising:
a crystal oscillator comprising an input end, an output end, a first grounding end and a second grounding end;
a first capacitor with one end connected to the input end; and
a second capacitor with one end connected to the output end,
wherein the first grounding end is connected to a first grounding hole, the second grounding end is connected to a second grounding hole,
the other end of the first capacitor is connected to a third grounding hole,
and the other end of the second capacitor is connected to a fourth grounding hole; and
the first grounding hole, the second grounding hole, the third grounding hole and the fourth grounding hole are independent of one another and are not in ground connection to a motherboard on a layer where the crystal oscillator circuit is located;
the crystal oscillator circuit further comprises: a first differential signal line connected to one end of the first capacitor;

a second differential signal line connected to one end of the second capacitor;

and a guard trace constructed to surround the crystal oscillator, the first capacitor, the second capacitor, the first differential signal line and the second differential signal line, wherein the guard trace is provided with a plurality of fifth grounding holes;

wherein the guard trace comprises a first part, a second part and a third part, wherein the first part and the second part are located on two sides of the crystal oscillator, widths of the first part and widths of the second part are within a third preset interval range, the third part is located below the crystal oscillator, and a width of the third part is not less than the width of the first part or the width of the second part.

* * * * *